(12) United States Patent
Sun et al.

(10) Patent No.: US 12,471,374 B2
(45) Date of Patent: Nov. 11, 2025

(54) METHOD OF FABRICATING ARRAY SUBSTRATE AND ARRAY SUBSTRATE THEREOF

(71) Applicants: BEIHAI HUIKE PHOTOELECTRICS TECHNOLOGY CO., LTD., Beihai (CN); HKC CORPORATION LIMITED, Shenzhen (CN)

(72) Inventors: Song Sun, Beihai (CN); Qin Xiong, Beihai (CN); Jinsong Lu, Beihai (CN); Je-Hao Hsu, Beihai (CN); Haijiang Yuan, Beihai (CN)

(73) Assignees: BEIHAI HUIKE PHOTOELECTRICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 438 days.

(21) Appl. No.: 17/973,476

(22) Filed: Oct. 25, 2022

(65) Prior Publication Data
US 2023/0137855 A1 May 4, 2023

(30) Foreign Application Priority Data
Oct. 29, 2021 (CN) .......................... 202111271191.1

(51) Int. Cl.
*H10D 86/60* (2025.01)
*H10D 30/67* (2025.01)
(Continued)

(52) U.S. Cl.
CPC ......... *H10D 86/60* (2025.01); *H10D 30/6734* (2025.01); *H10D 30/6755* (2025.01);
(Continued)

(58) Field of Classification Search
CPC .......... H10D 30/6734; H10D 30/6755; H10D 86/0221; H10D 86/423; H10D 86/441; H10D 86/443; H10D 86/60; H10D 99/00
See application file for complete search history.

(56) References Cited

U.S. PATENT DOCUMENTS

| | | | | |
|---|---|---|---|---|
| 2006/0145161 A1* | 7/2006 | Lee | ........................ | H10D 86/60 257/E27.111 |
| 2020/0027958 A1* | 1/2020 | Suzuki | ...................... | G09F 9/30 |

FOREIGN PATENT DOCUMENTS

| | | |
|---|---|---|
| CN | 101097928 A | 1/2008 |
| CN | 109616496 A | 4/2019 |

* cited by examiner

*Primary Examiner* — Matthew C Landau
*Assistant Examiner* — Dmitriy Yemelyanov

(57) ABSTRACT

A method of fabricating an array substrate and an array substrate are disclosed. The array substrate includes a bonding portion, the bonding portion being fabricated by: providing a substrate, and forming a metal layer on the substrate; sequentially depositing a first and a second insulating layer material on the metal layer; etching the first and second insulating layer material respectively at a first etching rate and a second etching rate to form a first insulating layer having a first via hole and a second insulating layer having a second via hole, respectively, thus obtaining a composite insulating layer of a double-layer structure; forming on the composite insulating layer an electrode layer connected to the metal layer through the first and second via holes to form the bonding portion; where the first etching rate and the second etching rate are different, and the first and second via holes are arranged correspondingly.

6 Claims, 6 Drawing Sheets

(51) Int. Cl.
*H10D 86/01* (2025.01)
*H10D 86/40* (2025.01)
*H10D 99/00* (2025.01)

(52) U.S. Cl.
CPC ....... *H10D 86/0221* (2025.01); *H10D 86/423* (2025.01); *H10D 86/443* (2025.01); *H10D 99/00* (2025.01)

METHOD OF FABRICATING ARRAY SUBSTRATE AND ARRAY SUBSTRATE THEREOF

CROSS-REFERENCE TO RELATED APPLICATIONS

This application claims the priority and benefit of Chinese patent application 2021112711911, entitled "Method of Fabricating Array Substrate and Array Substrate Thereof" and filed Oct. 29, 2021, with China National Intellectual Property Administration, the entire contents of which are incorporated herein by reference.

TECHNICAL FIELD

The present application relates to the field of display technology, and in particular, to a method of fabricating an array substrate and an array substrate thereof.

BACKGROUND

The description provided in this section is intended for the mere purpose of providing background information related to the present application but doesn't necessarily constitute prior art.

A display device may include a display panel, a printed circuit board, a timing controller, etc. The normal operation of the display panel requires devices such as the printed circuit board and the timing controller to provide signal input or processing for it. Therefore, in the production process of the display device, the display panel, the printed circuit board, the timing controller, etc. need to be connected together, and they may be connected together by means of bonding.

Specifically, the display panel includes an array substrate, and various components and the bonding portion is arranged on the array substrate. The display panel is connected to the bonding regions of the printed circuit board and the timing controller through the bonding portion, and further the bonding portion and the components are connected through vias to realize electrical signal connections. Since the insulating layer of the array substrate may be a double-layer or multi-layer structure, an undercut will appear at the vias, resulting in short-circuit or disconnection between the components and the bonding portion, so that the stability of the bonding portion is poor.

SUMMARY

In view of the above, it is a purpose of the present application to provide a method of fabricating an array substrate and an array substrate thereof, where by using different etching rates in the bonding portion to etch the composite insulating layer on the metal layer, the composite insulating layer may be prevented from forming undercuts at the via holes, thereby improving the stability of the bonding portion.

The present application discloses a method of fabricating an array substrate. The array substrate includes a bonding portion. The method of fabricating the array substrate includes the method of fabricating the bonding portion. The method of fabricating the bonding portion comprises the steps: providing a substrate, and forming a metal layer on the substrate; sequentially depositing a first insulating layer material and a second insulating layer material on the metal layer; etching the first insulating layer material using a first etching rate to form a first insulating layer having a first via hole; etching the second insulating layer material at a second etching rate to form a second insulating layer having a second via hole, so as to obtain a composite insulating layer with a double-layer structure; forming an electrode layer connected to the metal layer through the first via hole and the second via hole on the composite insulating layer to form a bonding portion; where the magnitudes of the first etching rate and the second etching rate are different, and the first via hole and the second via hole are arranged correspondingly.

Compared with the solution in which an undercut appears in the via hole in the bonding portion, resulting in poor stability of the array substrate, in the present application, when the bonding portion is fabricated, the insulating layer is composed of at least two different insulating layers, which is beneficial to enhance the insulating effect between the metal layer and the electrode layer, and improve the interface characteristics of the bonding surface between the metal layer and the insulating layer. At the same time, during the fabrication process, different etch rates are used to etch different insulating layers, so that different insulating layers may be etched with more targeted and suitable etch rates, avoiding etching problems such as undercuts formed by different insulating layers at the vias, and thus avoiding the problem of disconnection at the vias caused by problems such as undercuts, improving the stability of the bonding portion.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

DETAILED DESCRIPTION OF EMBODIMENTS

Figure 1:
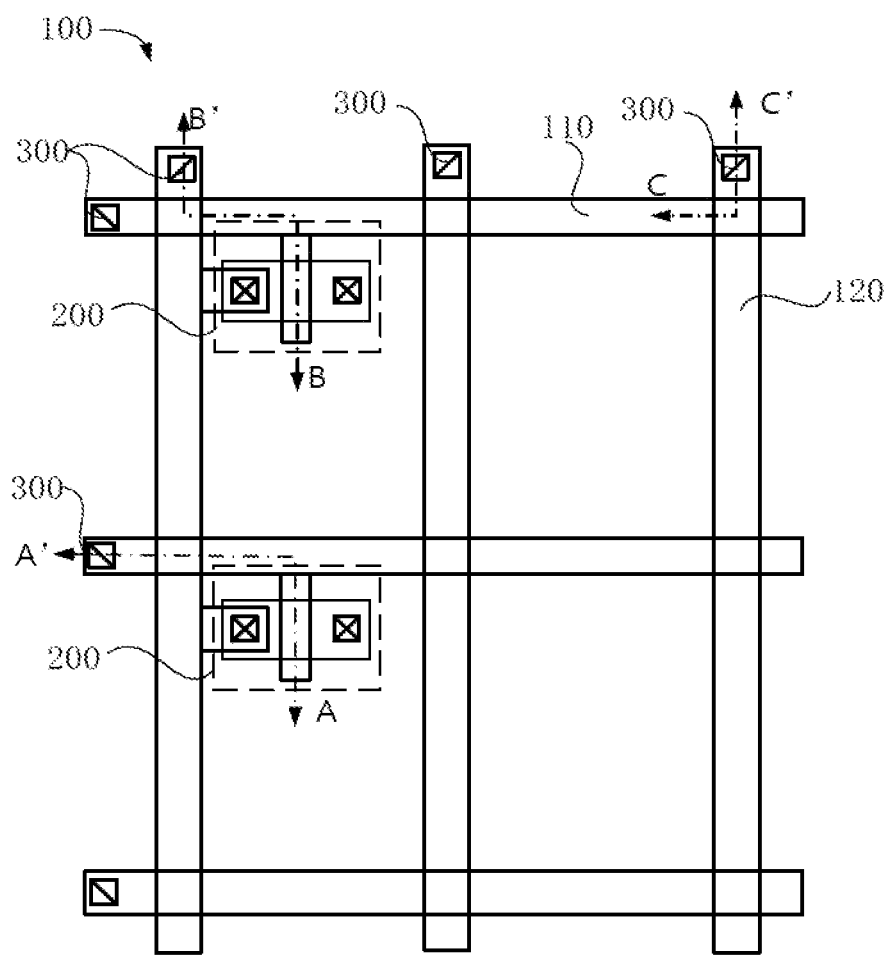
FIG. 1 is a schematic diagram of an array substrate according to a first embodiment of the present application.

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. Term "comprising", "including", and any variants thereof mean non-exclusive inclusion, so that one or more other features, integers, steps, operations, units, components, and/or combinations thereof may be present or added.

In addition, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application may be understood depending on specific contexts.

Hereinafter this application will be described in further detail with reference to the accompanying drawings and some optional embodiments.

Embodiment 1

FIG. 1 is a schematic diagram of an array substrate according to a first embodiment of the present application. Referring to FIG. 1, the present application discloses an array substrate. The array substrate includes a scan lines, a data lines, a thin film transistor and a bonding portion. The scan line is provided in a plurality. The data line is provided in a plurality. The thin film transistor includes a first gate layer, a semiconductor layer, and a source and drain layer. The source and drain layer includes a source layer and a drain layer. The first gate layer is connected to the scan line. The source layer is connected to the data line. The bonding portion includes a metal layer, a composite insulating layer, and an electrode layer. The metal layer is connected to the scan line and/or the data line. The composite insulating layer is arranged on the metal layer. The composite insulating layer is provided with a via hole. The composite insulating layer includes at least two insulating layers. The via hole penetrates through the at least two insulating layers. The via hole in the at least two insulating layers gradually increase in diameter along the extending direction of the metal layer toward the insulating layer. The electrode layer is connected to the metal layer through the via hole.

In this embodiment, the array substrate includes scan lines, data lines, thin film transistors, and a bonding portion. The bonding portion includes a metal layer, a composite insulating layer, and an electrode layer. The electrode layer is connected to the metal layer through the via in the composite insulating layer. The metal layer may be formed in the same layer as the first gate layer, or in the same layer as the source and drain. When making the thin film transistor, the bonding portion may be made at the same time, reducing the manufacturing process. Furthermore, the composite insulating layer is composed of at least two insulating layers, and the diameter of the via hole in each insulating layer gradually increases, which avoids the problem of undercuts, prevents the electrode layer from disconnecting, and improves the stability of the array substrate.

When the metal layer and the first gate layer are formed in the same layer and connected by a scan line, the bonding portion may be used as a gate bonding portion. When the metal layer is formed in the same layer as the source and drain layer, and the metal layer is connected to the source layer through a data line, then the bonding portion may be used as a source bonding portion. When the metal layer is formed in the same layer as the source and drain layer, and the metal layer is connected to the source layer through a data line, the metal layer may further include a first metal layer. The first metal layer and the first gate layer are formed in the same layer, but the first metal layer is disconnected from the first gate layer. The first metal layer and the metal layer are connected through the electrode layer to form the source bonding portion. In this case, the source bonding portion has a double-layer metal structure to reduce impedance and improve the stability of the array substrate.

Embodiment 2

Figure 2:
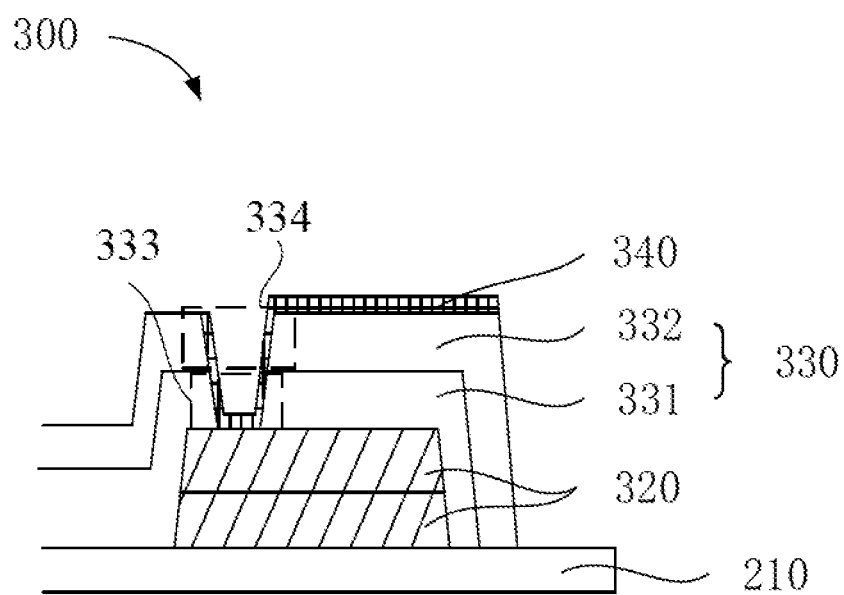
FIG. 2 is a schematic cross-sectional view of a bonding portion in a second embodiment of the present application taken along line C-C' shown in FIG. 1.
Figure 3:
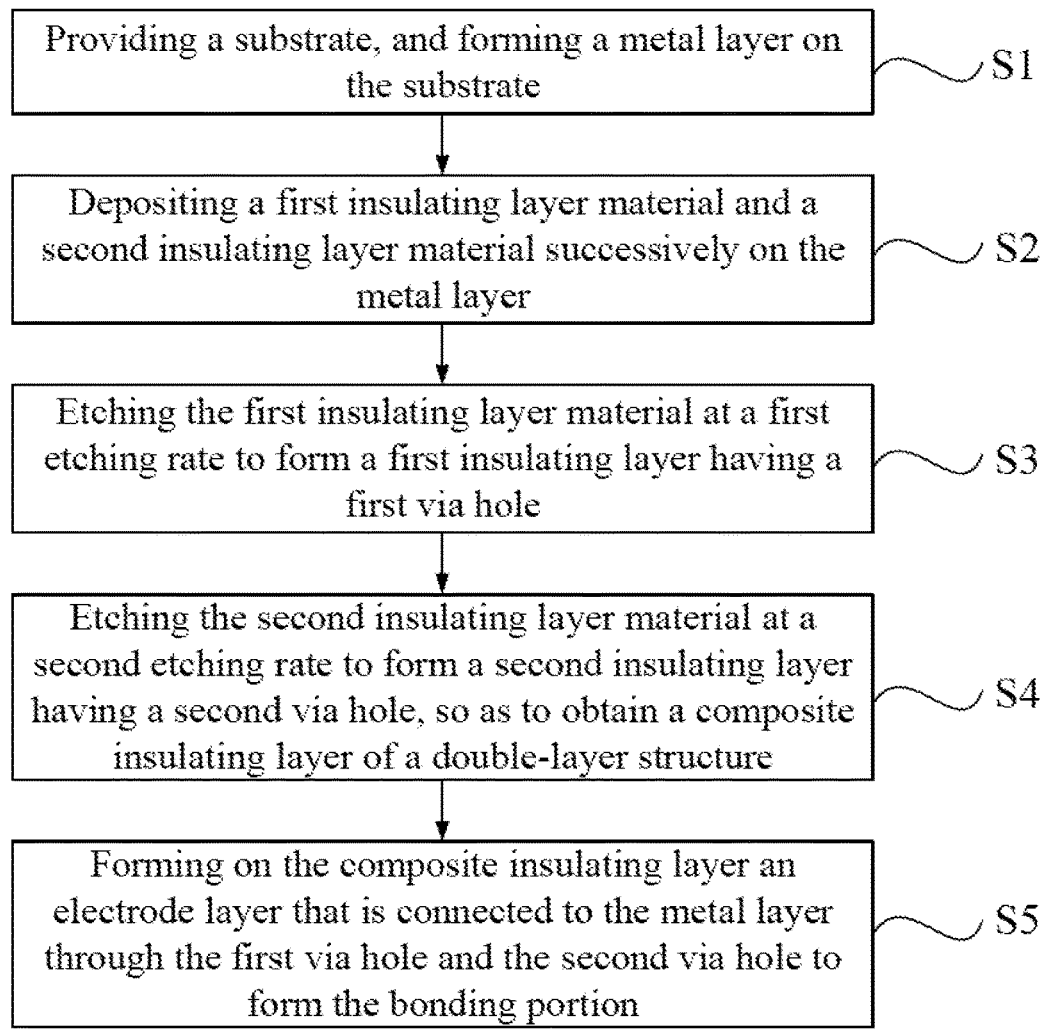
FIG. 3 is a flowchart of a method of fabricating the bonding portion in the second embodiment of the present application.

FIG. 2 is a schematic cross-sectional view of the bonding portion in a second embodiment of the present application taken along line C-C' of FIG. 1. FIG. 3 is a flowchart of a method of fabricating the bonding portion in the second embodiment of the present application. Referring to FIG. 2 and FIG. 3, the present application discloses a method for fabricating an array substrate. The array substrate includes a bonding portion, and the method of fabricating the array substrate includes a method of fabricating the bonding portion. The method of fabricating the bonding portion comprises the following steps:

S1, providing a substrate, and forming a metal layer on the substrate;

S2, sequentially depositing a first insulating layer material and a second insulating layer material on the metal layer;

S3, using a first etching rate to etch the first insulating layer material to form a first insulating layer with a first via hole 333;

S4, using a second etching rate to etch the second insulating layer material to form a second insulating layer with a second via hole 334 to obtain a composite insulating layer with a double-layer structure;

S5, forming an electrode layer connected to the metal layer through the first via hole 333 and the second via hole 334 on the composite insulating layer to form a bonding portion;

where the magnitudes of the first etching rate and the second etching rate are different, and the first via hole 333 and the second via hole 334 are arranged correspondingly.

Compared with the solution in which an undercut appears in the via hole in the bonding portion, resulting in poor stability of the array substrate, in the present application, when the bonding portion is fabricated, the insulating layer is composed of at least two different insulating layers, which is beneficial to enhance the insulating effect between the metal layer and the electrode layer, and improve the interface characteristics of the bonding surface between the metal layer and the insulating layer. At the same time, during the fabrication process, different etch rates are used to etch different insulating layers, so that different insulating layers may be etched with more targeted and suitable etch rates, avoiding etching problems such as undercuts formed by different insulating layers at the vias, and thus avoiding the problem of disconnection at the vias caused by problems such as undercuts, improving the stability of the bonding portion.

FIG. 4 through FIG. 8 show the entire manufacturing process of the display panel of the present application by showing schematic diagrams of film layer changes in the manufacturing process.

Figure 4:
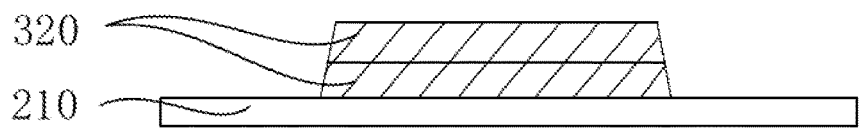
FIG. 4 is a schematic diagram of a first stage of film layer changes in the fabrication process of the bonding portion of the second embodiment of the present application.

Specifically, FIG. 4 is a schematic diagram of a first stage of the film layer changes in the fabrication process of the bonding portion of the second embodiment of the present application. As shown in FIG. 4, a schematic diagram of forming the metal layer 320 on the substrate 210 in step S1 is shown. First, a metal layer is formed on a substrate, where the metal layer may be a flexible substrate or a non-flexible substrate, i.e., PI (polyimide), plastic, thin glass or metal foil, etc. A buffer layer is first grown on the substrate, and a composite layer structure of Mo with a thickness of 100-150 nm and ITO with a thickness of 50-100 nm is sputtered on the buffer layer as a metal layer. Since the molybdenum metal material and insulating layer have few etching options in dry-etching, the dry-etching atmosphere will lose the metal of the molybdenum electrode layer or even etch the molybdenum electrode completely, the ITO layer is used as the stop layer to protect the Mo layer. Of course, the metal layer may also be made of other metal materials, such as Ti, Cr, Al, or other materials.

Figure 5:
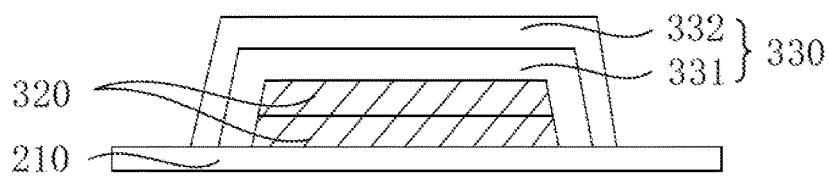
FIG. 5 is a schematic diagram of a second stage of the film layer changes in the fabrication process of the bonding portion of the second embodiment of the present application.
Figure 6:
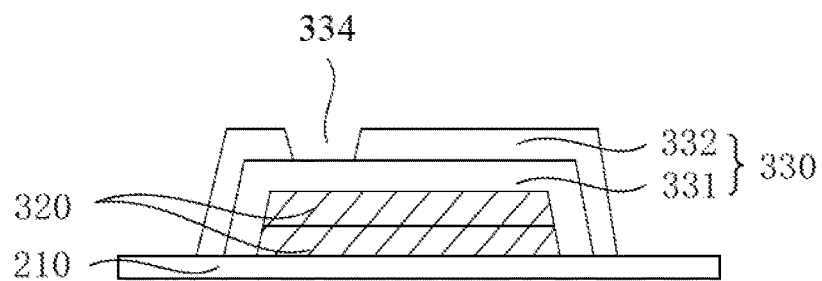
FIG. 6 is a schematic diagram of a third stage of the film layer changes in the fabrication process of the bonding portion of the second embodiment of the present application.
Figure 7:
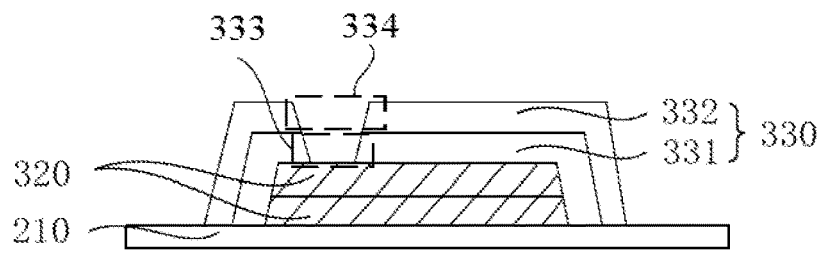
FIG. 7 is a schematic diagram of a fourth stage of the film layer changes in the fabrication process of the bonding portion of the second embodiment of the present application.

FIG. 5 is a schematic diagram of a second stage of the film layer changes in the fabrication process of the bonding portion of the second embodiment of the present application. FIG. 6 is a schematic diagram of a third stage of the film layer changes in the fabrication process of the bonding portion of the second embodiment of the present application. FIG. 7 is a schematic diagram of a fourth stage of the film layer changes in the fabrication process of the bonding portion of the second embodiment of the present application. As shown in FIG. 5 to FIG. 7, the schematic diagrams of the composite insulating layer 330 with the double-layer structure of the first insulating layer 331 and the second insulating layer 332 are formed on the metal layer 320 in steps S2 to S4. Compared with the insulating layer of the single-layer structure, the insulating effect and stability of the composite insulating layer are better. The first insulating layer and the second insulating layer may each be an inorganic insulating layer or an organic insulating layer, including any one of silicon nitride (SiNx) or silicon oxide (SiOx), and may be composed of at least one of the SiNx layer or the SiOx layer. The specific material is selected according to the material of the metal layer and the actual application.

Then, the first insulating layer material and the second insulating layer material are etched respectively by using the first etching rate and the second etching rate to form the second insulating layer having the second via hole 334 and the first insulating layer having the first via hole 333. The first via hole 333 and the second via hole 334 are arranged correspondingly to obtain a composite insulating layer with a double-layer structure. The first insulating layer and the second insulating layer are etched by different etching processes respectively, which avoids the phenomenon of undercut caused by different etching rates of the first insulating layer and the second insulating layer under the same etching solution and different materials. Furthermore, the first insulating layer and the second insulating layer are etched with different etching rates respectively, which also avoids the phenomenon of undercutting caused by the same etching rate of the first insulating layer and the second insulating layer of different materials when they are etched under the same etching rate.

Figure 8:
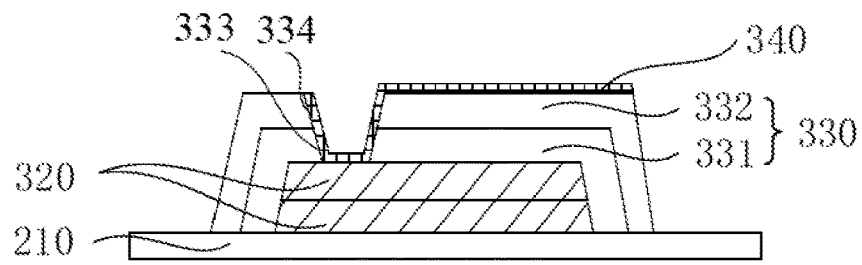
FIG. 8 is a schematic diagram of a fifth stage of the film layer changes during the fabrication process of the bonding portion in the second embodiment of the present application.

FIG. 8 is a schematic diagram of a fifth stage of the film layer changes during the fabrication process of the bonding portion in the second embodiment of the present application. As shown in FIG. 8, a schematic diagram of forming the electrode layer 340 is shown. After the above steps are completed, go to step S5, where a magnetron sputtering apparatus is used to deposit a layer of indium tin oxide material on the composite insulating layer, and the layer of indium tin oxide material with the electrode layer of the metal layer through the first via hole 333 and the second via hole 334, so that the metal layer is extended to the surface of the composite insulating layer through the electrode layer to form a bonding portion, so that the array substrate may be connected with other components through the bonding portion. The electrode layer may also be made of other metal conductive materials, such as Mo or the like.

Further, in order to improve the stability of the bonding portion, the first insulating layer is made of silicon nitride. The step S3 of using the first etching rate to etch the first insulating layer material to form the first insulating layer with the first via hole 333 includes:

S31, etching the first insulating layer material with an etching rate of 1.8 nm/s to form the first insulating layer having the first via hole 333.

The second insulating layer is made of silicon dioxide. The step S4 of using the second etching rate to etch the second insulating layer material to form the second insulating layer having the second via hole 334 to obtain the composite insulating layer of the double-layer structure includes:

S41, dry-etching the second insulating layer material at an etching rate of 7.1 nm/s to form the second insulating layer having the second via hole 334, so as to obtain the composite insulating layer with the double-layer structure.

In this embodiment, in the above step S2, a $Si_3N_4$ layer with a thickness of 200-250 nm and a $SiO_2$ layer with a thickness of 50-100 nm are continuously deposited on the metal layer as the first insulating layer material and the second insulating layer material, respectively. Since both $Si_3N_4$ and $SiO_2$ have good dielectric withstand voltage performance, high stability and good interface characteristics with the metal layer, the interface characteristics between the composite insulating layer and the metal layer may be better. At the same time, the first insulating layer and the second insulating layer are made with different thicknesses, so that the insulating performance may be better.

The second insulating layer material is dry-etched at an etching rate of 7.1 nm/s, and the first insulating layer material is etched at an etching rate of 1.8 nm/s. During the etching process, $Cl_2$, $SF_6$, or a mixture of $Cl_2$ and $SF_6$ is used as the etching gas, and the undercut is prevented by using different etching rates. The selection of etch rates of 7.1 nm/s and 1.8 nm/s is based on related experiments. After many repeated verifications, the undercut will not appear under this rate condition. The range of the first etch rate may be set 6.8-7.3 nm/s, and the range of the second etch rate may be set 1.5-2.1 nm/s to ensure that the bonding part does not have undercuts thus improving the stability of the bonding part.

The dry-etching gas and etching rates may be selected according to the needs, as long as the etching rate of the upper insulating layer is faster to improve the production rate, and the etching rate of the lower insulating layer is slower to improve the undercut.

Of course, in order to better improve the problem of undercutting, it is also possible to optimize the photoresist formed in the mask process. Specifically, in the usual etching process, the standard exposure dose is 20-25 mj/cm2. When etching the second insulating layer, on the basis of the standard exposure dose (20-25 mj/cm2), the exposure dose is increased (90-100 mj/cm2), to etch out the second via hole 334 that exposes the surface of the first insulating layer. Due to the increased exposure of the second via hole 334 formed at this time, the diameter of the photoresist corresponding to the position of the second via hole 334 is relatively large, so that the diameter of the second via hole 334 pattern obtained subsequently becomes slightly larger after development. Correspondingly, in the subsequent exposure process, another layer of photoresist may be formed. In this case, the standard exposure dose (20-25 mj/cm2) is used for exposure. In this case, the diameter of the photoresist corresponding to the first via hole 333 will be smaller. In this case, the diameter of the first via hole 333 obtained later will be smaller than the diameter of the second via hole 334, thereby further improving the problem of undercutting. Furthermore, since a certain gradient is formed between the first via hole 333 and the second via hole 334, the disconnection problem of the electrode layer at the first via hole 333 and the second via hole 334 is further improved.

It is also possible to first deposit a $SiO_2$ layer with a thickness of 50-100 nm as the first insulating layer material, and then deposit a $Si_3N_4$ layer with a thickness of 200-250 nm as the second insulating layer material.

Embodiment 3

Figure 9:
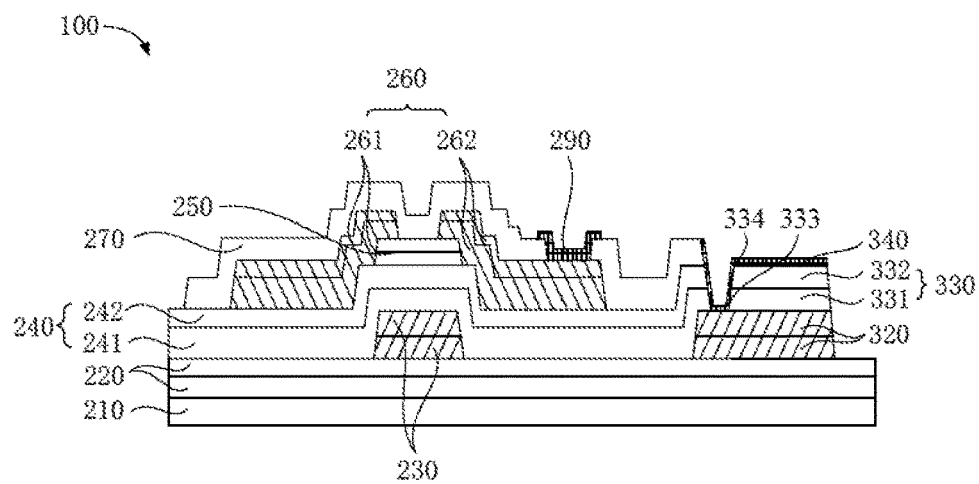
FIG. 9 is a schematic cross-sectional view of an array substrate of a third embodiment of the present application taken along line A-A' shown in FIG. 1.
Figure 10:
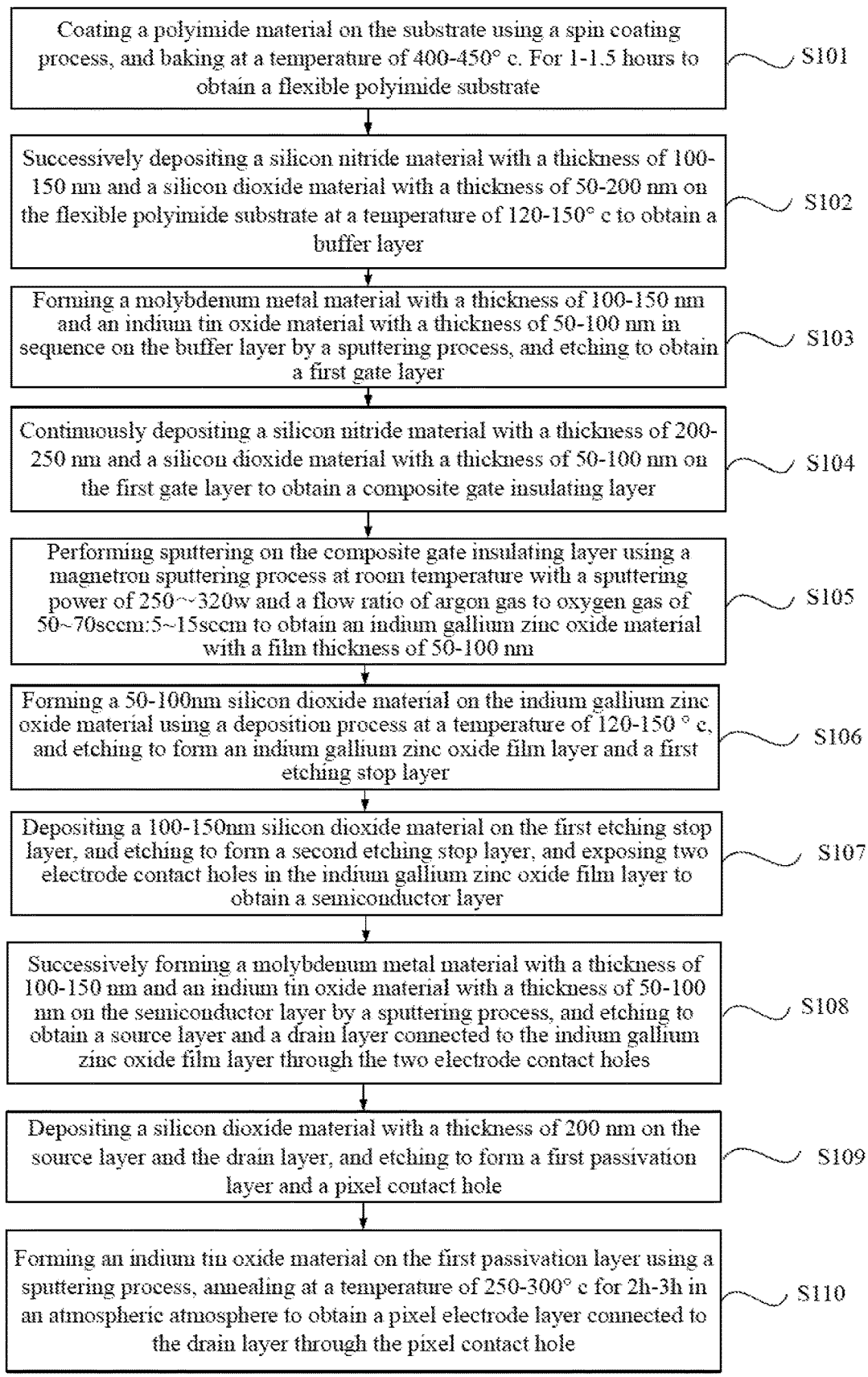
FIG. 10 is a flowchart of a method of fabricating an array substrate according to the third embodiment of the present application.

FIG. 9 is a schematic cross-sectional view of an array substrate of a third embodiment of the present application taken along line A-A' shown in FIG. 1. FIG. 10 is a flowchart of a method of fabricating an array substrate according to the third embodiment of the present application. Referring to FIGS. 1 to 10, as an embodiment of the array substrate of the present application, the array substrate 100 includes a display region and a non-display region. The bonding portion 300 is arranged in the non-display region. A first gate layer 230, a gate insulating layer 240, a semiconductor layer 250, a source and drain layer 260 (including the source layer 261 and the drain layer 262) and a first passivation layer 270 are sequentially formed on the substrate 210 corresponding to the display region to form the thin film transistor 200. The metal layer 320 is formed in the same layer as the first gate layer 230 and is connected to the first gate layer 230. The composite insulating layer 330 and the gate insulating layer 240 are formed in the same layer.

In this embodiment, scan lines 110 and data lines 120 are disposed on the array substrate 100, which may include a display region and a non-display region. The display region is provided with a thin film transistor 200. The metal layer 320 is formed in the same layer as the first gate layer 230 of the thin film transistor 200. The composite insulating layer 330 is formed in the same layer as the gate insulating layer 240. In this way, the bonding part 300 may be used as a gate bonding part. The metal layer 320 is connected to the first gate layer 230 through the scan line 110. The gate bonding portion uses different etching rates to etch the composite insulating layer 330, which avoids the problem of undercutting and ensures that there is no disconnection problem at the gate bonding portion. Furthermore, the gate insulating layer 240 is also made of a double-layer structure, which may be an inorganic insulating layer or an organic insulating layer, including any one of silicon nitride (SiNx) or silicon oxide (SiOx), and may be made of at least one of a SiNx layer or a SiOx layer, so that the interface between the composite gate insulating layer 240 and the first gate layer 230 has stronger bonding properties and better insulating performance, so that the stability of the array substrate 100 is improved.

As an embodiment of the present application, the present application further discloses a method for fabricating a thin film transistor. In the actual fabrication process, the thin film transistor may be either a top-gate structure or a bottom-gate structure. This application takes the thin film transistor as the bottom-gate structure as an example. The method of fabricating the array substrate includes a method of fabricating a thin film transistor, and the method of fabricating the thin film transistor includes:

S101, coating a polyimide material on the substrate using a spin coating process, and baking at a temperature of 400-450° C. for 1-1.5 hours to obtain a flexible polyimide substrate;

S102, successively depositing a silicon nitride material with a thickness of 100-150 nm and a silicon dioxide material with a thickness of 50-200 nm to obtain a buffer layer on the flexible polyimide substrate at a temperature of 120-150° C.;

S103, sequentially forming a molybdenum metal material with a thickness of 100-150 nm and an indium tin oxide material with a thickness of 50-100 nm on the buffer layer using a sputtering process, and etching to obtain a first gate layer;

S104, continuously depositing a silicon nitride material with a thickness of 200-250 nm and a silicon dioxide material with a thickness of 50-100 nm on the first gate layer to obtain a composite gate insulating layer;

S105, performing a sputtering operation on the composite gate insulating layer using a magnetron sputtering process with a sputtering power of 250-320 W and a flow ratio of argon to oxygen of 50~70 sccm:5~15 sccm, to obtain an indium gallium zinc oxide material with a film thickness of 50-100 nm;

S106, forming a 50-100 nm silicon dioxide material on the indium gallium zinc oxide material using a deposition process at a temperature of 120-150° C., and etching to form an indium gallium zinc oxide film layer and a first etching stop layer;

S107, depositing a silicon dioxide material of 100-150 nm on the first etching stop layer, and etching to form a second etching stop layer and two electrode contact holes exposing the indium gallium zinc oxide film layer to obtain a semiconductor layer;

S108, using a sputtering process to form molybdenum metal material with a thickness of 100-150 nm and an indium tin oxide material with a thickness of 50-100 nm in sequence on the semiconductor layer, and etching to obtain a source layer 261 and a drain layer 262 connected to the indium gallium zinc oxide film layer through the two electrode contact holes;

S109, depositing a silicon dioxide material with a thickness of 200 nm on the source layer and the drain layer 262, and etching to form a first passivation layer and a pixel contact hole;

S110, using a sputtering process to form an indium tin oxide material on the first passivation layer, annealing for 2 h-3 h at a temperature of 250-300° C. in an atmospheric atmosphere to obtain a pixel electrode layer connected to the drain layer 262 through the pixel contact hole.

The substrate of the array substrate may be made of a non-flexible material, such as glass, or a flexible material, such as a polyimide material. In this embodiment, a flexible substrate is used as an example. While forming the thin film transistor, the bonding portion in the non-display region is formed simultaneously. First, in step S101, a layer of polyimide material is coated on a glass substrate by a spin coating process, and then baked at a temperature of 400-450° C. for 1-1.5 hours to form a 10-15 μm flexible polyimide substrate. Then in step S102, a buffer layer is grown on the flexible polyimide substrate. In order to enhance the interface bonding characteristics between the buffer layer and the first gate layer and metal layer thus improving the stability of the array substrate, the buffer layer adopts a double-layer structure, where a composite structure of a $Si_3N_4$ layer with a thickness of 100-150 nm and a $SiO_2$ layer with a thickness of 150-200 nm is used as the buffer layer. The buffer layer adopts chemical deposition technique, and the film deposition temperature is 120-150° C.

In step S103, on the buffer layer, sputtering equipment is used to sequentially sputter a Mo molybdenum metal material with a thickness of 100-150 nm and an ITO indium tin oxide material with a thickness of 50-100 nm to etch them and pattern them by photolithography and other processes to obtain a first gate layer and a metal layer with a double-layer structure of Mo layer and ITO layer. In step S104, a $Si_3N_4$ layer with a thickness of 200-250 nm and a $SiO_2$ layer with a thickness of 50-100 nm are successively deposited on the first gate layer and the metal layer to form a composite gate insulating layer having a first gate insulating layer and a second gate insulating layer on the first gate layer, and a composite insulating layer having a first insulating layer and a second insulating layer on the metal layer.

In step S105, on the composite gate insulating layer, a magnetron sputtering apparatus is used to sputter the IGZO film layer at room temperature, the sputtering power is 250-320 W, and the flow ratio of Ar to O2 is 50~70 sccm:5~15 sccm, the thickness of IGZO film is 50-100 nm. In order to protect the semiconductor layer from being affected by water, oxygen and acid etching solution in the process, after the semiconductor layer is sputtered, step S106 is performed. First, the PECVD (plasma chemical vapor deposition) method is used to deposit a layer of $SiO_2$ with a thickness of 50-100 nm as the first etching stop in the environment of 120-150° C. The photoresist pattern of the semiconductor layer island structures is fabricated by the photolithography process. Then, the $SiO_2$ layer other than the island structures is removed by etching through a dry-etching process, and then the active film layer is etched with oxalic acid to form a semiconductor layer structure.

Then proceed to step S107, after completing the first layer of the etch stop layer ES on the IGZO film layer, PECVD is then used to deposit a layer of $SiO_2$ with a thickness of 100-150 nm as the second etch stop layer. Then the IGZO film layer is exposed by dry-etching, and two electrode contact holes of the source and drain layers 260 (including the source layer 261 and the drain layer 262) in the next step are formed at the same time to obtain the semiconductor layer. The semiconductor layer is made of IGZO material. Since In3+ ions in the IGZO material may form 5S electron orbitals, the mobility of electrons is 35 cm2V-1 s-1, with a mobility of more than 15 cm2/(Vs), which is conducive to the transport of high-speed free carriers inside the semiconductor. Furthermore, the metal oxide thin film transistor of IGZO also has the advantages of simple fabricating process, transparency and good uniformity, which makes the performance of the thin film transistor better. In addition, two etching stop layers are made on the IGZO layer, which may effectively protect the IGZO film layer from being eroded by etching gas and water vapor, hence better stability.

In step S108, a source and drain layer 260 (including the source layer 261 and the drain layer 262) is formed on the semiconductor layer. The source and drain layer 260 (including the source layer 261 and the drain layer 262) is also made as a double-layer structure of the Mo layer and ITO layer. Using a sputtering process, a 100-150 nm molybdenum metal material and a 50-100 nm ITO indium tin oxide material are sequentially formed on the semiconductor layer, and the source layer 261 and drain layer 262 connected to the IGZO film layer through two electrode contact holes are obtained by etching. Next, step S109 is performed. On the source layer 261 and the drain layer 262, a PECVD deposition method is used to deposit a $SiO_2$ film with a thickness of 200 nm as the first passivation layer, and etching is performed to form a pixel contact hole exposing the drain electrode, as well as a first via hole 333 and a second via hole 334 exposing the metal layer.

In step S110, a magnetron sputtering apparatus is used to deposit an ITO material on the first passivation layer. Annealing is then performed at a temperature of 250-300° C. for 2 h-3 h in an atmospheric atmosphere to obtain a pixel electrode layer connected to the drain layer 262 through the pixel contact hole, and an electrode layer connected to the metal layer through the first via hole 333 and the second via hole 334, forming the bonding portion. The annealing treatment makes the bonding property at the interface between the pixel electrode layer and the drain layer 262, and the bonding property at the interface between the electrode layer and the metal layer stronger, so that the stability of the bonding portion is better.

During this process, the bonding portion acts as a gate bonding portion. The metal layer and the first gate layer are formed in the same layer and connected to each other, and both adopt a composite double-layer structure of Mo and ITO. The ITO film layer acts as a stop layer to well protect the Mo layer, and also prevents the possibility of undercutting the first gate layer when forming the channel, avoids poor contact, and makes the thin film transistor more stable. In addition, the first gate layer and the metal layer are fabricated in the same process, which also reduces the process of separately fabricating the metal layer. In addition, the composite gate insulating layer and the composite insulating layer are also made by the same etching process, which reduces the process of making the bonding portion separately and greatly reduces the manufacturing cost. Furthermore, the first passivation layer and the second insulating layer are made of the same material, which reduces one etching process, improves the production efficiency, and further increases the productivity of the array substrate.

Embodiment 4

Figure 11:
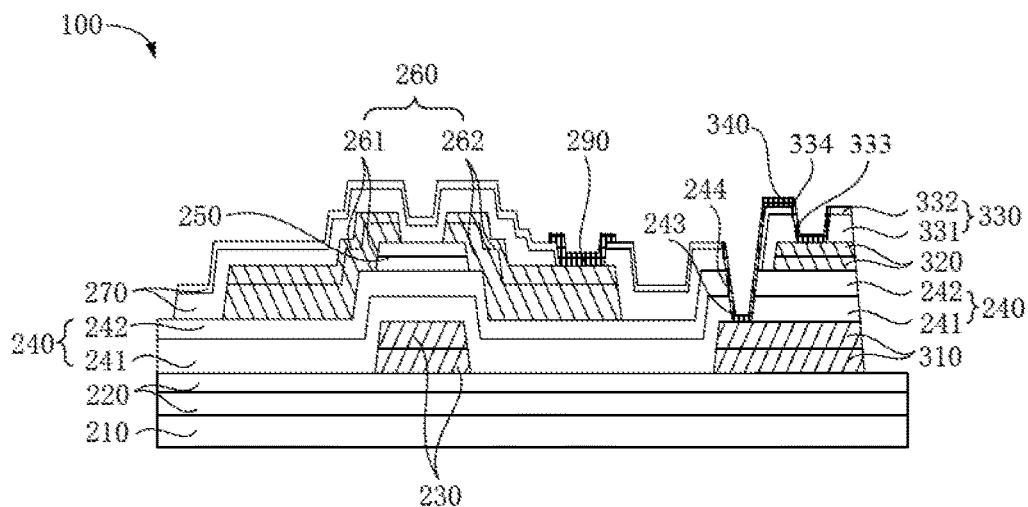
FIG. 11 is a schematic cross-sectional view of an array substrate according to a fourth embodiment of the present application taken alone line B-B' in FIG. 1.
Figure 12:
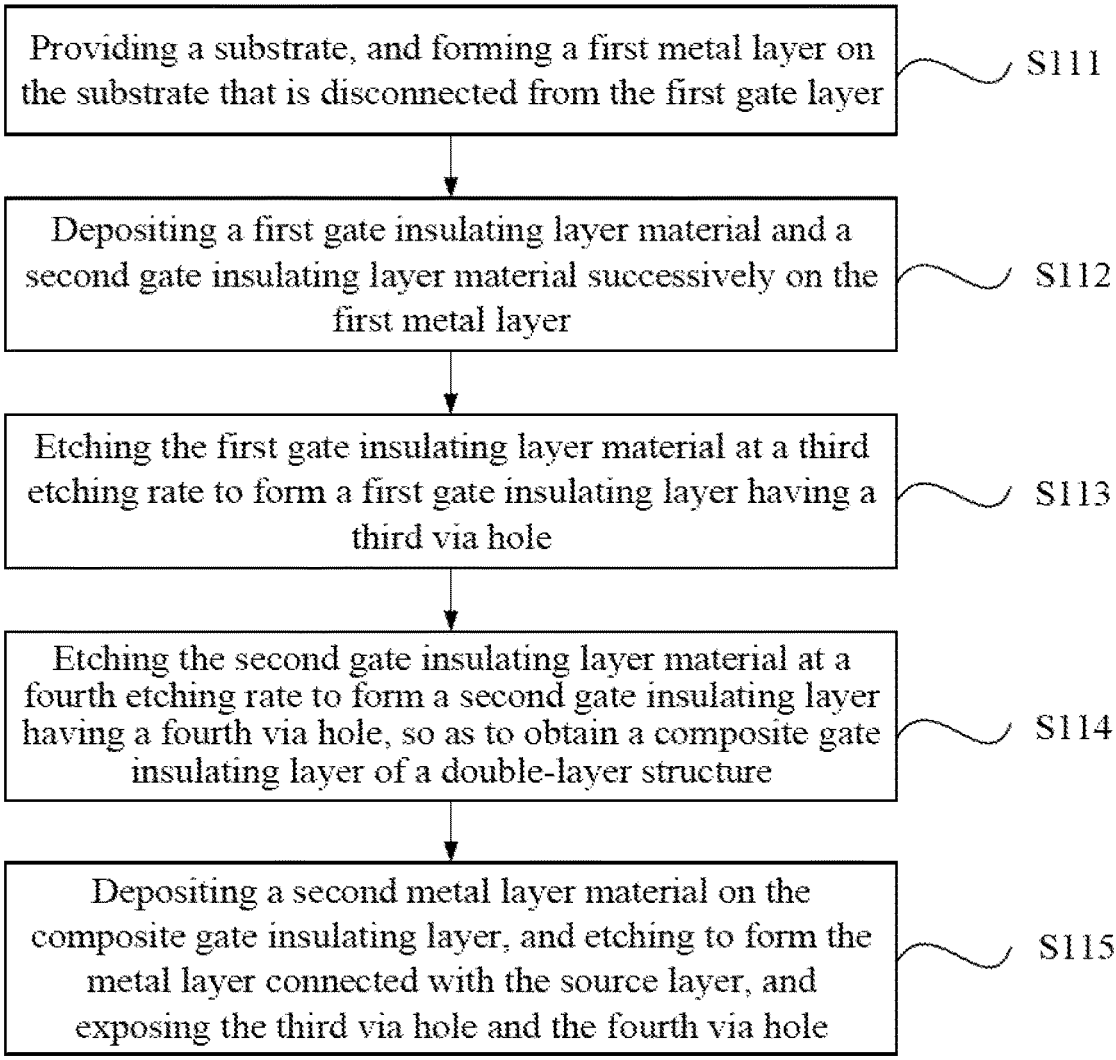
FIG. 12 is a flowchart of a method of fabricating an array substrate according to the fourth embodiment of the present application.

FIG. 11 is a schematic cross-sectional view of an array substrate according to a fourth embodiment of the present application taken along line B-B' shown in FIG. 1. FIG. 12 is a flowchart of a method for fabricating the array substrate according to the fourth embodiment of the present application. Referring to FIG. 11 and FIG. 12, the array substrate 100 includes a display region and a non-display region. The bonding portion 300 is arranged in the non-display region. A first gate layer 230, a gate insulating layer 240, a semiconductor layer 250, a source and drain layer 260 (including the source layer 261 and the drain layer 262) and a first passivation layer 270 are sequentially formed on the substrate 210 corresponding to the display region to form the thin film transistor 200. The source and drain layer 260 (including the source layer 261 and the drain layer 262) includes a source layer 261 and a drain layer 262. The metal layer 320 is formed in the same layer as the source and drain layers 260 (including the source layer 261 and the drain layer 262). The composite insulating layer 330 and the first passivation layer 270 are formed in the same layer.

In this embodiment, the bonding portion 300 serves as a source bonding portion. The metal layer 320 is connected with the source layer 241 through the data line 120, and connected with the metal layer 320 through the electrode layer 340 to form a source bonding portion for connecting components. The metal layer 320 and the source and drain layer 260 (including the source layer 261 and the drain layer 262) are formed in the same layer, and the composite insulating layer 330 and the first passivation layer 270 are formed in the same layer, which reduces the process of separately fabricating the source bonding portion and reduces the manufacturing cost. In addition, different etching rates are used to form via holes in different insulating layers, which avoids the generation of undercuts and improves the stability of the array substrate 100.

Specifically, the metal layer 320 and the source and drain layer 260 (including the source layer 261 and the drain layer 262) are formed in the same layer, then the source bonding portion may be a one-layer metal layer structure, or may have a two-layer metal layer structure. That is, the metal layer 320 further includes a first metal layer 310. The first metal layer 310 and the first gate layer 230 are formed in the same layer, but the first metal layer 310 and the first gate layer 230 are disconnected. The double-layer metal structure of the source bonding part may also reduce the impedance.

Taking the source bonding portion of a double-layer metal structure as an example, the step S1 of providing a substrate and forming a metal layer on the substrate includes:

S111, providing a substrate, and forming a first metal layer disconnected from the first gate layer on the substrate;

S112, sequentially depositing a first gate insulating layer material and a second gate insulating layer material on the first metal layer;

S113, using a third etching rate to etch the first gate insulating layer material to form a first gate insulating layer having a third via hole;

S114, using a fourth etching rate to etch the second gate insulating layer material to form a second gate insulating layer having a fourth via hole, so as to obtain a composite gate insulating layer with a double-layer structure;

S115, depositing a second metal layer material on the composite gate insulating layer, and etching to form a metal layer connected with the source layer, and exposing the third via hole and the fourth via hole;

The step S5 of forming an electrode layer connected to the metal layer through the first via hole 333 and the second via hole 334 on the composite insulating layer to form a bonding portion includes:

S511, forming on the composite gate insulating layer and the composite insulating layer an electrode layer that is connected with the metal layer through the first via hole 333 and the second via hole 334, and that is connected to the first metal layer through the third via hole and the fourth via hole, thus forming the bonding portion;

where the third etching rate and the fourth etching rate are different, and the third via hole and the fourth via hole are arranged correspondingly.

In this embodiment, the bonding portion is made of a two-layer metal structure, including a first metal layer and a metal layer. The first metal layer may be formed in the same layer as the first gate layer. The metal layer may be formed on the same layer as the source and drain layer 260 (including the source layer 261 and the drain layer 262). The first metal layer has the same material and thickness as the first gate layer. The metal layer is the same material and thickness as the source and drain layer 260 (including the source layer 261 and the drain layer 262). When the thin film transistor is fabricated, the bonding portion is formed simultaneously, which reduces the manufacturing process and improves the production efficiency. In this case, the first passivation layer of the thin film transistor may be made of a double-layer structure, where the double-layer structure may be formed in the same layer as the first insulating layer and the second insulating layer of the composite insulating layer respectively, and the first passivation layer and the composite insulating layer are made of the same material and the same thickness.

When fabricating the array substrate, when the first gate layer is formed, a first metal layer disconnected from the first gate layer is simultaneously formed on the substrate. A first gate insulating layer and a second gate insulating layer are sequentially formed on the first gate layer and the first metal layer. When forming the source and drain layer 260 (including the source layer 261 and the drain layer 262), a metal layer connected to the source layer is formed at the same time. A first passivation layer with a double-layer structure is sequentially formed on the source-drain layer 260 (including the source layer 261 and the drain layer 262) and the metal layer. Next, an etching process is performed, and different processes are used to form contact holes in the first metal layer and the metal layer, so as to solve the problem of undercutting.

Specifically, take $Si_3N_4$ material for the first insulating layer and $SiO_2$ material for the second insulating layer as an example. That is, the first passivation layer adopts a double-layer structure of $Si_3N_4$ and $SiO_2$. The first insulating layer and the first gate insulating layer use $Si_3N_4$ layers with a thickness of 200-250 nm. The second insulating layer and the second gate insulating layer use $SiO_2$ layers with a thickness of 50-100 nm. When the second insulating layer is dry-etched at the second etching rate, etching may be performed at the same time to obtain the second via hole 334 in the metal layer and the pixel contact hole in the drain layer 262 and to expose the first insulating layer from the third via hole. The first insulating layer is dry-etched at a first etch rate, and at the same time, a first via hole 333 is formed in the metal layer, a pixel contact hole in the drain layer 262 is exposed, and the second gate insulating layer is exposed from the third via hole. Then, the second gate insulating layer is dry-etched at a third etching rate to form a third via hole. Finally, the first gate insulating material is dry-etched at a fourth etching rate to form a fourth via hole.

Next, an ITO material is deposited on the corresponding first passivation layer to form an ITO film layer, and the ITO film layer is etched to form a pixel electrode layer that passes through the pixel contact hole and is connected to the drain electrode, an electrode layer that is connected to the metal layer through the first via hole 333 and the second via hole 334 and that is connected to the first metal layer through the third via hole and the fourth via hole. The pixel contact hole, the first via hole 333, and the second via hole 334 are formed by different etching processes and different etching rates from the third via hole and the fourth via hole, thus avoiding the possibility of undercutting of double-layer passivation layer structure when etching the via hole in the double-layer passivation layer, so that the possibility of disconnection of the electrode layer is prevented, and the stability of the bonding portion is further improved.

In addition, in this embodiment, the first metal layer and the first gate layer are disconnected, and the metal layer is formed in the same layer as the source and drain layer 262 and is used to connect to the data lines. The first metal layer is used in parallel with the metal layer to reduce the impedance of the wiring. In addition, the first metal layer may also enhance the connection performance between the electrode layer and the metal layer, reduce the risk of disconnection, and further improve the stability of the bonding portion.

Further, in order to reduce the number of processes in the manufacturing process of the array substrate and improve the stability of the array substrate, the material and thickness of the first gate insulating layer are the same as those of the first insulating layer, and the material and thickness of the second gate insulating layer are the same as those of the second insulating layer. The composite gate insulating layer and the composite insulating layer are formed through the same process. In this embodiment, the composite gate insulating layer and the composite insulating layer are made of the same material and have the same thickness. For example, the first gate insulating layer and the first insulating layer are made of the same material, and the second gate insulating layer and the second insulating layer are made of the same material, which may reduce at least two etching processes. That is, the second via hole 334 and the third via hole are simultaneously etched by a first etching process, and the first via hole 333 and the fourth via hole are simultaneously etched by a second process. In this case, the second etching rate is equal to the third etching rate, and the first etching rate is equal to the fourth etching rate.

Of course, the first gate insulating layer and the second insulating layer may also be made of the same material. The second gate insulating layer and the first insulating layer are made of the same material, so that the second via hole 334 may be formed by a first etching process, the first via hole 333 and the third via hole may be simultaneously formed by a second etching process, and the fourth via may be formed by a third etching process. In this way, one etching process may be reduced, thereby reducing the manufacturing cost. In addition, if one of the composite gate insulating layer and the composite insulating layer has only one layer, then the same etching step may be shared for the film layers of the same material, which may reduce the etching process, reduce the manufacturing cost, and improve the manufacturing efficiency.

In addition, when the bonding portion is a two-layer metal layer structure, the first gate layer and the first metal layer may also be connected, but the metal layer is connected to the data line and the source layer. That is, the bonding portion serves as a gate bonding portion that is connected with the scan lines, so as to reduce the impedance of the traces.

Embodiment 5

Figure 13:
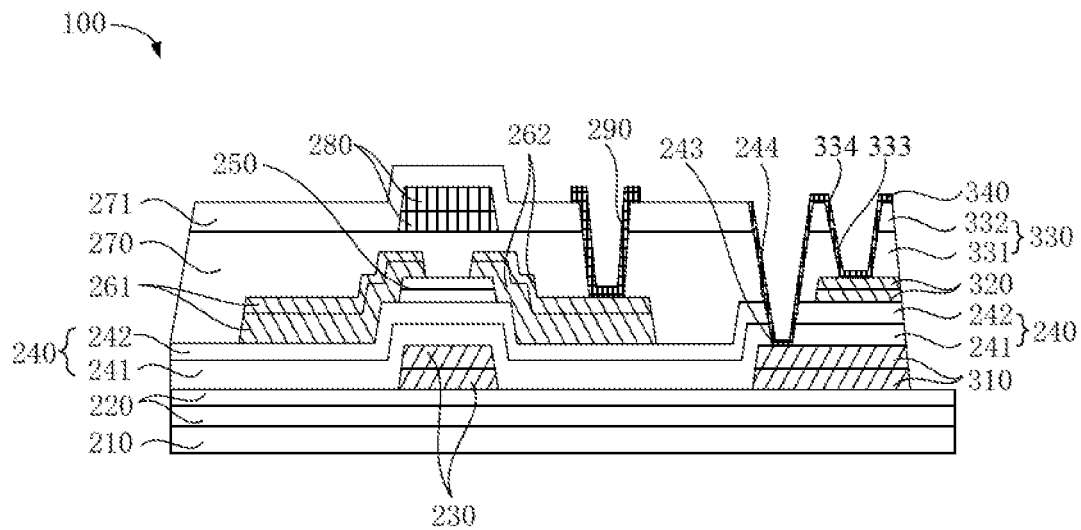
FIG. 13 is a schematic cross-sectional view of an array substrate of a fifth embodiment the present application taken alone line B-B' shown in FIG. 1.

FIG. 13 is a schematic cross-sectional view of an array substrate of a fifth embodiment of the present application taken along line B-B' shown in FIG. 1. Referring to FIG. 13, the thin film transistor 300 may also have two gate layers. That is, the thin film transistor 300 has a double gate structure. A second gate layer 280 is further formed on the first passivation layer 270. The second gate layer 280 is disposed corresponding to the first gate layer 230. A second passivation layer 271 is formed on the second gate layer 280.

In this embodiment, the thin film transistor 300 has a double gate structure, where a second gate layer 280 is formed on the first passivation layer 270. The second gate layer 280 is disposed corresponding to the first gate layer 230 to reduce the excessive parasitic capacitance generated between the second gate layer 280 and the source-drain layer 260. A second passivation layer 271 is further disposed on the second gate layer 280. In addition, the double gate structure is also conducive to improving the switching characteristics of the thin film transistor and achieving better switching effects. The substrate 210 may be made of a non-flexible material, such as glass, etc., or may be made of a flexible material, such as a polyimide material. When the substrate 210 is made of a flexible material, the double gate structure may also solve the problem of defects such as cracks in the film layers due to bending of the flexible device, and the stability of the array substrate 100 is better.

In this embodiment, when the thin film transistor 300 adopts a double-gate structure, at the position of the bonding portion 300, the metal layer 320 of the source bonding portion may be a double-layer metal structure, which may be a parallel structure of two metal layers in the first gate layer 230, the source and drain layers 260 (including the source layer 261 and the drain layer 262) and the second gate layer 280, and may also be a parallel structure of three metal layers. When the metal layer 320 adopts the parallel structure of the first gate layer 230 and the source and drain layers 260 (including the source layer 261 and the drain layer 262), the metal layer 320 between the first passivation layer 270 and the second passivation layer 271 may be completely etched away at the position corresponding to the bonding portion 300, so that the first passivation layer 270 and the second passivation layer 271 form the composite insulating layer 330. In this case, the first passivation layer 270 and the second passivation layer 271 may adopt a single-layer structure, and the composite insulating layer 330 has a double-layer structure. When one or both of the first passivation layer 270 and the second passivation layer 271 is a multi-layer structure, then the composite insulating layer 330 is a multi-layer structure. Finally, the pixel electrode layer 290 and the electrode layer 340 are formed in the same process, which reduces the manufacturing cost.

In the manufacturing process of the array substrate, when the first passivation layer and the second passivation layer are made of the same material and the same thickness, that is, the first passivation layer and the second passivation layer are both $SiO_2$ films with a thickness of 200 nm, the same etching process may be used to etch the pixel contact holes penetrating the first passivation layer and the second passivation layer, and the first via hole 333 and the second via hole 334 that pass through the composite insulating layer to expose the metal layer. Next, an ITO material is deposited on the second passivation layer to form a pixel electrode layer that is connected with the drain layer 262 through the pixel electrode hole, and an electrode layer that is connected with the metal layer through the first via hole 333 and the second via hole 334. Completing the fabrication of the thin film transistor and the bonding portion at the same time may reduce the possibility of undercutting, improve the stability of the array substrate, reduce the manufacturing process, and reduce the manufacturing cost.

In addition, when the array substrate has a double gate structure, the bonding portion may also have a three-layer metal structure. Corresponding metal layers may be connected according to actual requirements, so that the bonding portion is a source bonding portion or a gate bonding portion, so as to achieve a better effect of reducing impedance and further improve the stability of the array substrate.

Embodiment 6

Figure 14:
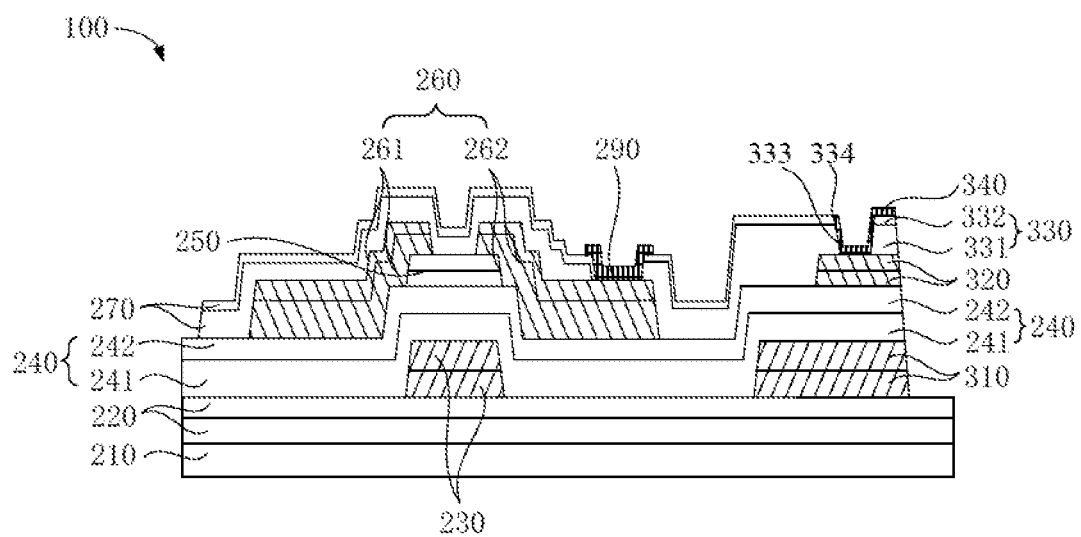
FIG. 14 is a schematic cross-sectional view of an array substrate of a sixth embodiment of the present application taken alone line B-B' shown in FIG. 1.

FIG. 14 is a schematic cross-sectional view of an array substrate of a six embodiment of the present application along line B-B' shown in FIG. 1. Referring to FIG. 14, when the bonding portion 300 is used as the source bonding portion, it may also have a single-layer metal layer structure. The metal layer 320 is formed in the same layer as the source and drain layers 260 (including the source layer 261 and the drain layer 262) of the thin film transistor 200. Therefore, the step S1 of providing a substrate and forming a metal layer on the substrate includes:

S121, providing a substrate, and depositing a first gate insulating material and a second gate insulating material in sequence on the substrate, so as to obtain a composite gate insulating layer having a first gate insulating layer and a second gate insulating layer;

S122, depositing a second metal layer material on the composite gate insulating layer, and etching to obtain a metal layer connected to the source layer 261.

In this embodiment, the bonding portion may be a source bonding portion having a single-layer metal layer structure. The metal layer and the source and drain layer 260 (including the source layer 261 and the drain layer 262) are formed in the same layer, and the metal layer is connected to the data line and the source layer 261. In addition, through the composite gate insulating layer, the metal layer and the data line are located at the same height, and the flatness is stronger, which avoids the disconnection between the metal line and the data line, and improves the stability of the bonding portion. Furthermore, the process of separately manufacturing the bonding portion is saved, and the manufacturing cost is reduced. Of course, the bonding portion may also be a source bonding portion with a double-layer metal layer structure, that is, it may have a first metal layer formed in the same layer as the first gate layer, and a metal layer formed in the same layer as the source and drain layer 260 (including the source layer 261 and the drain layer 262). However, the first metal layer is not connected to the first gate layer, the first metal layer is also not connected to the metal layer, and the source bonding portion is connected to the data line and the source layer 261 through the metal layer.

It should be noted that the limitations of various operations involved in this solution will not be deemed to limit the order of the operations, provided that they do not affect the implementation of the specific solution, so that the operations written earlier may be executed earlier or they may also be executed later or even simultaneously. As long as the solution may be implemented, they should all be regarded as falling in the scope of protection of this application.

It should be noted that the inventive concept of the present application may be formed into many embodiments, but the length of the application document is limited and so these embodiments cannot be enumerated one by one. The technical features may be arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A method for fabricating an array substrate, wherein the array substrate comprising a bonding portion, the method for fabricating the array substrate comprises a method for fabricating the bonding portion, and wherein the method for fabricating the bonding portion comprises:
   providing a substrate, and forming a metal layer on the substrate;
   depositing a first insulating layer material and a second insulating layer material successively on the metal layer;
   etching the first insulating layer material at a first etching rate to form a first insulating layer having a first via hole;
   etching the second insulating layer material at a second etching rate to form a second insulating layer having a second via hole, so as to obtain a composite insulating layer of a double-layer structure;
   forming on the composite insulating layer an electrode layer that is connected to the metal layer through the first via hole and the second via hole to form the bonding portion;
   wherein the first etching rate and the second etching rate have different magnitudes, and wherein the first via hole and the second via hole are arranged correspondingly;

wherein the array substrate comprises a display region and a non-display region, and the bonding portion is disposed in the non-display region;

wherein the array substrate further comprises a first gate layer, a gate insulating layer, a semiconductor layer, a source and drain layer, and a first passivation layer that are successively formed on the substrate corresponding to the display region;

wherein the source and drain layer comprises a source layer and a drain layer;

wherein the metal layer is formed in a same layer as the source and drain layer, and the composite insulating layer is formed in a same layer as the first passivation layer;

wherein the operation of providing a substrate and forming a metal layer on the substrate comprises:

providing a substrate, and forming a first metal layer on the substrate that is disconnected from the first gate layer;

depositing a first gate insulating layer material and a second gate insulating layer material successively on the first metal layer;

etching the first gate insulating layer material at a third etching rate to form a first gate insulating layer having a third via hole;

etching the second gate insulating layer material at a fourth etching rate to form a second gate insulating layer having a fourth via hole, so as to obtain a composite gate insulating layer of a double-layer structure; and depositing a second metal layer material on the composite gate insulating layer, and etching to form the metal layer connected with the source layer, and exposing the third via hole and the fourth via hole;

wherein the operation of forming on the composite insulating layer an electrode layer that is connected to the metal layer through the first via hole and the second via hole to form a bonding portion comprises:

forming on the composite gate insulating layer and the composite insulating layer an electrode layer that is connected to the metal layer through the first via hole and the second via hole and that is connected to the first metal layer through the third via hole and the fourth via hole, thus forming the bonding portion;

wherein the third etching rate and the fourth etching rate have different magnitudes, and wherein the third via hole and the fourth via hole are arranged correspondingly.

2. The method as recited in claim 1, wherein the first gate insulating layer have identical material and thickness with those of the first insulating layer, and the second gate insulating layer have identical material and thickness with those of the second insulating layer;

wherein the composite gate insulating layer and the composite insulating layer are formed through a same process.

3. The method as recited in claim 2, wherein when the first gate layer is being formed, the first metal layer disconnected from the first gate layer is simultaneously formed on the substrate; wherein the first gate insulating layer and the second gate insulating layer are sequentially formed on the first gate layer and the first metal layer; and wherein when the source and drain layer is being formed, the metal layer connected to the source layer is simultaneously formed.

4. The method as recited in claim 3, wherein when the metal layer is formed in the same layer as the source and drain layer, and when the metal layer is connected to the source layer through the respective data line, the bonding portion is a source bonding portion.

5. A method for fabricating an array substrate, wherein the array substrate comprising a bonding portion, the method for fabricating the array substrate comprises a method for fabricating the bonding portion, and wherein the method for fabricating the bonding portion comprises:

providing a substrate, and forming a metal layer on the substrate;

depositing a first insulating layer material and a second insulating layer material successively on the metal layer;

etching the first insulating layer material at a first etching rate to form a first insulating layer having a first via hole;

etching the second insulating layer material at a second etching rate to form a second insulating layer having a second via hole, so as to obtain a composite insulating layer of a double-layer structure;

forming on the composite insulating layer an electrode layer that is connected to the metal layer through the first via hole and the second via hole to form the bonding portion;

wherein the first etching rate and the second etching rate have different magnitudes, and wherein the first via hole and the second via hole are arranged correspondingly;

wherein the first insulating layer is made of silicon nitride, the second insulating layer is made of silicon dioxide, and wherein the operation of etching the first insulating layer material at a first etching rate to form a first insulating layer having a first via hole comprises:

etching the first insulating layer material at an etching rate of 1.8 nm/s to form the first insulating layer having the first via hole;

wherein the operation of etching the second insulating layer material at a second etching rate to form a second insulating layer having a second via hole so as to obtain a composite insulating layer of a double-layer structure comprises:

dry-etching the second insulating layer material at an etching rate of 7.1 nm/s to form the second insulating layer having the second via hole, so as to obtain the composite insulating layer of the double-layer structure.

6. A method for fabricating an array substrate, wherein the array substrate comprising a bonding portion, the method for fabricating the array substrate comprises a method for fabricating the bonding portion, and wherein the method for fabricating the bonding portion comprises:

providing a substrate, and forming a metal layer on the substrate;

depositing a first insulating layer material and a second insulating layer material successively on the metal layer;

etching the first insulating layer material at a first etching rate to form a first insulating layer having a first via hole;

etching the second insulating layer material at a second etching rate to form a second insulating layer having a second via hole, so as to obtain a composite insulating layer of a double-layer structure;

forming on the composite insulating layer an electrode layer that is connected to the metal layer through the first via hole and the second via hole to form the bonding portion;

wherein the first etching rate and the second etching rate have different magnitudes, and wherein the first via hole and the second via hole are arranged correspondingly;

wherein the method for fabricating the array substrate comprises a method for fabricating a thin film transistor, and wherein the method for fabricating the thin film transistor comprises:

coating a polyimide material on the substrate using a spin coating process, and baking at a temperature of 400-450° C. for 1-1.5 hours to obtain a flexible polyimide substrate;

successively depositing a silicon nitride material with a thickness of 100-150 nm and a silicon dioxide material with a thickness of 50-200 nm on the flexible polyimide substrate at a temperature of 120-150° C. to obtain a buffer layer;

forming a molybdenum metal material with a thickness of 100-150 nm and an indium tin oxide material with a thickness of 50-100 nm in sequence on the buffer layer by a sputtering process, and etching to obtain a first gate layer;

continuously depositing a silicon nitride material with a thickness of 200-250 nm and a silicon dioxide material with a thickness of 50-100 nm on the first gate layer to obtain a composite gate insulating layer;

performing sputtering on the composite gate insulating layer using a magnetron sputtering process at room temperature with a sputtering power of 250~320 W and a flow ratio of argon gas to oxygen gas of 50~70 sccm:5~15 sccm to obtain an indium gallium zinc oxide material with a film thickness of 50-100 nm;

forming a 50-100 nm silicon dioxide material on the indium gallium zinc oxide material using a deposition process at a temperature of 120-150° C., and etching to form an indium gallium zinc oxide film layer and a first etching stop layer;

depositing a 100-150 nm silicon dioxide material on the first etching stop layer, and etching to form a second etching stop layer, and exposing two electrode contact holes in the indium gallium zinc oxide film layer to obtain a semiconductor layer;

successively forming a molybdenum metal material with a thickness of 100-150 nm and an indium tin oxide material with a thickness of 50-100 nm on the semiconductor layer by a sputtering process, and etching to obtain a source layer and a drain layer connected to the indium gallium zinc oxide film layer through the two electrode contact holes;

depositing a silicon dioxide material with a thickness of 200 nm on the source layer and the drain layer, and etching to form a first passivation layer and a pixel contact hole;

forming an indium tin oxide material on the first passivation layer using a sputtering process, annealing at a temperature of 250-300° C. for 2 h-3 h in an atmospheric atmosphere to obtain a pixel electrode layer connected to the drain layer through the pixel contact hole.

* * * * *